United States Patent [19]

Kurita

[11] Patent Number: 5,341,091

[45] Date of Patent: Aug. 23, 1994

[54] APPARATUS AND METHOD FOR GENERATING SYNCHRONIZED CONTROL SIGNALS IN A SYSTEM FOR TESTING ELECTRONIC PARTS

[75] Inventor: Jun Kurita, Tokyo, Japan

[73] Assignee: Hewlett-Packard Company, Palo Alto, Calif.

[21] Appl. No.: 934,368

[22] Filed: Aug. 24, 1992

[30] Foreign Application Priority Data

Aug. 28, 1991 [JP] Japan .................. 3-242614

[51] Int. Cl.$^5$ .......................... G01R 31/28
[52] U.S. Cl. .................. 324/750; 324/73.1; 371/62
[58] Field of Search ............ 324/73.1, 158 R, 158 F; 437/8; 371/15.1, 16.1, 22.1, 25.1, 27.1, 62

[56] References Cited

U.S. PATENT DOCUMENTS

| | | | |
|---|---|---|---|
| 4,656,632 | 4/1987 | Jackson | 371/20 |
| 4,744,084 | 5/1988 | Beck et al. | 324/73.1 |
| 4,788,492 | 11/1988 | Schubert | 324/73.1 |
| 4,806,852 | 2/1989 | Swan et al. | 324/73 |
| 4,816,750 | 3/1989 | Van der Kloot et al. | 324/73 |
| 4,864,574 | 9/1989 | Pritt | 371/61 |
| 5,095,262 | 3/1992 | Henley et al. | 324/73.1 |
| 5,162,728 | 11/1992 | Huppenthal | 324/158 R |

OTHER PUBLICATIONS

Tamamura, Toshio, "Video DAC/ADC Dynamic Testing," 1986 International Test Conference, CH2339-0/86/0000/0652, 1986 IEEE, pp. 652-659 (no month).

Rosenfeld, Eric, "Timing Generation for DSP Testing," 1988 International Test Conference, CH2610-4/88/0000/0755, 1988 IEEE, pp. 755-763 (no month).

"HP 9490 Mixed Signal LSI Test System," Hewlett-Packard Company, May 1991, pp. 1-11.

*Primary Examiner*—Vinh Nguyen

[57] ABSTRACT

A testing system for testing electronic parts allows coexistence of the complicated control of signal generation and measurement and the time management thereof, enables a testing of a DUT under an environment close to that of a real operating environment and improves reliability of the testing. Slave subsystems are operated under control and management of a master subsystem. Control signal synchronizing means synchronize control signals from the master subsystem with one of master clocks MCLK1 and MCLK2, and outputs the synchronized control signal to the slave subsystems through clock distribution means. The clock distribution means is controlled such that master clock whose timing is identical with the synchronized control signal is input to each slave subsystem.

15 Claims, 1 Drawing Sheet

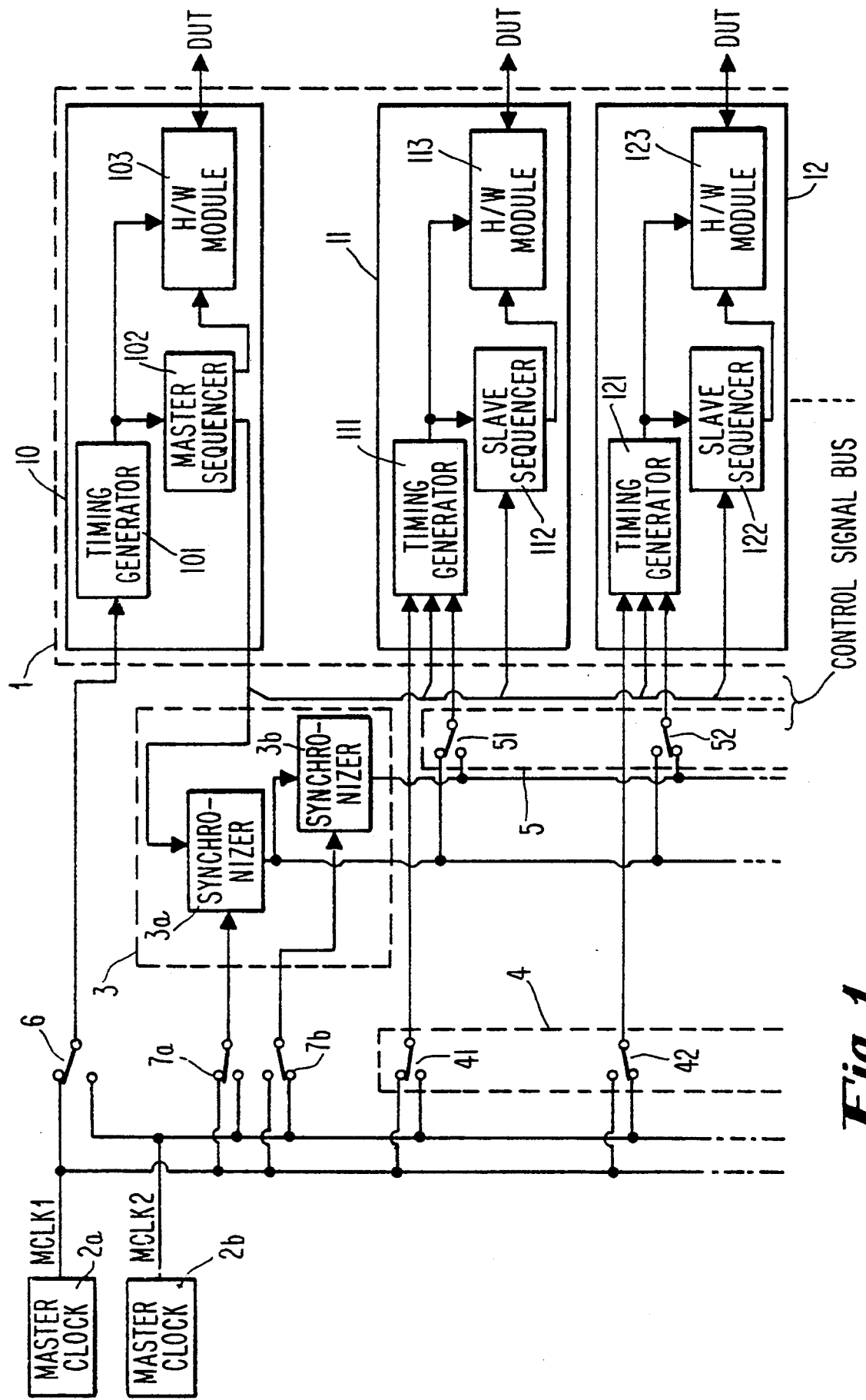

APPARATUS AND METHOD FOR GENERATING SYNCHRONIZED CONTROL SIGNALS IN A SYSTEM FOR TESTING ELECTRONIC PARTS

FIELD OF THE INVENTION

This invention relates to a testing device for testing electronic parts or the like. A preferred application of the invention is in testing LSI devices, transistors, etc., and particularly in testing the signal generating performance and signal receiving and analyzing performance of a device under test which is tested with a digital signal, an analog signal or a direct current (DC) signal.

This invention is related to the subject matter disclosed in U.S. patent application Ser. No. 952,469, filed Oct. 22, 1993, now U.S. Pat. No. 5,289,116, which is a continuation of Ser. No. 707,844, filed May 30, 1991, now abandoned. U.S. patent application Ser. No. 952,469, now U.S. Pat. No. 5,289,116, is hereby incorporated by reference. Embodiments of the present invention may be employed as one port of the system described in application Ser. No. 707,844, now abandoned.

BACKGROUND OF THE INVENTION

Recently, the integration of semiconductor integrated circuits such as LSIs has progressed more and more. In association with this progress in the area of integration, signal input and output operations have accelerated; at the same time, an LSI that employs digital signals, analog signals and DC signals as input and output signals has been developed.

A testing device for an LSI has a plurality of input and output channels each of which is used in accordance with one kind of signal and serves to perform an interface for each of the plural input and output terminals (input and output terminals of digital/analog signals and DC signals as described above) of a device under test (hereinafter referred to as a "DUT").

These input and output channels comprise plural hardware (H/W) modules, and each of these modules is generally operated under time control based on clocks (i.e., clock signals) that are obtained by dividing a single clock, a so-called master clock signal (hereinafter referred to as a "master clock") by an integer number.

Generally, a DUT is divided into plural functional blocks, and some DUTs are frequently operated with plural master clock systems. When these functional blocks are independent of each other, each of the H/W modules of the testing device is operated on the basis of the integer-divided clocks (that is, is operated while the clocks for the respective H/W modules are synchronized with one another) to test each functional block of the device under test. In this manner, a signal environment that substantially corresponds to the environment extant during the real operation of the DUT can be realized.

However, when independence between the functional blocks is low (in other words, when the functional blocks are highly interdependent), the use of signals derived from the integer division of one master clock as described above enables the generation and measurement of only signals having a clock relationship (e.g., frequency) of an integer ratio therebetween, so that there occurs a problem that it is possible only to realize a signal environment which substantially differs from that in the real operation of the DUT. In order to solve this problem, a testing device having two master clock generators which have dependent or independent relationship has been developed. However, a testing device that can simultaneously carry out both a complex control of a signal generation and measurement of each of the H/W modules and a time management thereof has not yet been developed. One of the reasons why such a testing device has not yet been produced resides in the fact that timing adjustment between the modules is carried out through a host computer or by using a special device for timing adjustment.

A known conventional testing device having two independent master clock generators can adjust the timing between the H/W modules only when a testing operation is started. However, in this testing device, the complicated control of the signal generation and measurement cannot be carried out with high accuracy, and the operation timing between the H/W modules operated with different master clocks has a control resolution of only about 1 micro second, and thus the testing device has a problem in reproducing the test timing of a high-speed DUT.

Accordingly, an object of the present invention is to provide a testing device with which an operation similar to a signal generation and measurement operation of a H/W module group operated with a single clock can be realized with at least two independent clock systems. The testing device should be capable of performing both the complicated control of the signal generation and measurement operations, such as realization of time coincidence and arbitrary time difference between events and the time management of the DUT, and should be capable of performing a test of the DUT under an environment closely similar to that extant in the DUT's actual operation, so that reliability of the testing can be improved. The present invention achieves these goals.

SUMMARY OF THE INVENTION

Testing devices in accordance with the present invention comprise a subsystem group comprising a master subsystem and a slave subsystem operated under control of said master subsystem; at least two master clock generators; master clock distribution means for outputting master clock signals of said master clock generators to said slave subsystem; control signal synchronizing means for receiving a control signal from said master subsystem and synchronizing the control signal with a selected one of the master clock signals, whereby a synchronized control signal is derived; and control synchronized signal distribution means for distributing the synchronized control signal to said slave subsystem.

Methods for testing electronic parts in accordance with the present invention comprise the steps of generating at least two master clock signals; distributing said master clock signals to a master subsystem and at least one slave subsystem; generating a control signal with said master subsystem; synchronizing said control signal with a selected one of the master clock signals, thereby deriving a synchronized control signal; distributing the synchronized control signal to said slave subsystem(s); and testing an electronic device in accordance with said synchronized control signal.

To attain the above-mentioned objects, a testing device for electronic parts and the like according to the present invention includes a subsystem group comprising a master subsystem and at least one slave subsystem which is operated under control and management of the master subsystem, at least two master clock generators, a master clock distribution means for outputting master clock signals of the master clock generators to each slave subsystem, a control signal synchronizing means for receiving a control signal from the master subsystem and synchronizing the control signal with any one of the master clock signals, and a control synchronized signal distribution means for distributing the synchronized control signal to each slave subsystem.

According to the present invention, the master and slave subsystems are under control of a central processing unit. When a testing operation is carried out, the testing device of this invention can be operated without the assistance of a central processing unit, while a conventional testing device carries out a timing adjustment between H/W modules through a host computer or a special device for timing adjustment.

When testing is carried out, the slave subsystem group comprising at least one (typically plural) slave subsystem is under the control and management of the master subsystem, and each slave subsystem is operated on the basis of a control signal from the master subsystem. Each master clock generator can also generate independent (that is, noninterdependent) clocks and make respective master clocks interdependent on one another; however, ordinarily the master clocks are designed to be independent of one another. A timing clock used in the master subsystem may be generated by inputting any one of the master clocks and on the basis of the input master clock, on the basis of a clock of the DUT, or on the basis of a clock other than the former two clocks. However, the timing clock is ordinarily generated on the basis of a single master clock.

The master subsystem itself may have functions of generating a signal for testing of the DUT and of receiving and measuring responses of the DUT, or may have only a function of controlling the slave subsystems.

On the other hand, portions for performing an asynchronous operation such as a distribution operation of control synchronized signals (the control signal assimilating means, the master clock distribution means and the control clock synchronizing means) are independently provided without distributing them over the master subsystem and the slave subsystems.

The control signal synchronizing means serves to generate a control signal synchronized with each master clock (that is, a control synchronized signal) through a synchronizing operation of the control signal from the master subsystem with each master clock, and the master clock from the master clock generator is outputted to each slave subsystem by the master clock distribution means.

At this time, when a control synchronized signal which is synchronized with a master clock is input to a slave subsystem, the master clock distribution means is controlled such that this master clock is distributed to the slave subsystem.

In the manner described above, each slave subsystem receives a master clock and a control synchronized signal which is in synchronism with the master clock, and an operating timing for the slave subsystem is generated by dividing the master clock by a predetermined number, whereby various operations, such as a signal generating operation, a signal receiving and analyzing operation, etc., are carried out under the control and management of the master subsystem. In any master clock system, uncertainty of a control synchronized signal (deviation between the master clock and the control synchronized signal) is suppressed below one period of the master clock (typically from nanosecond to sub nanosecond order) at maximum.

In one preferred embodiment of the invention (see FIG. 1), two synchronizers 3a, 3b are programmable via a host computer (not shown in the drawing). These synchronizers can synchronize sequence signals with a master clock signal within a multiple of one clock cycle of the master clock signal. Each subsystem can then output signals precisely timed, based on the synchronizers' accuracy in synchronization down to a nanosecond or less.

A slave subsystem operated with a timing which is obtained based on a master clock and another slave subsystem operated with a timing which is obtained based on another master clock are operated with independent timings, so that a pseudo environment which is limitlessly close to an environment for the real operation of the DUT is obtained.

BRIEF DESCRIPTION OF THE DRAWINGS

FIG. 1 is a partial circuit diagram of a preferred embodiment of the invention.

DETAILED DESCRIPTION OF THE PREFERRED EMBODIMENTS

FIG. 1 is a partial circuit diagram showing an embodiment of a testing device for electronic parts or the like according to this invention. This embodiment pertains to a testing device having two master clock generators 2a, 2b. A subsystem group i comprising master and slave subsystems includes a master subsystem 10 and slave subsystems 11, 12 . . .

The master subsystem 10 comprises a timing generator 101, a master sequencer 102 and a hardware module 103, and substantially similarly to the master subsystem 10, each of the slave subsystems 11, 12, . . . comprises a timing generator 111, 121, . . . , a slave sequencer 112, 122, . . . , and a hardware module 113, 123, . . . . A micro program memory (not shown) added to the master sequencer 102 is beforehand loaded with a test sequence, a control sequence for the slave sequencers 112, 122, . . . , etc. , and micro program memories (not shown) added to the slave sequencers 112, 122, . . . , are loaded with a control sequence for the hardware modules 113, 123, . . . . In this embodiment, the master sequencer 102 designed to receive a signal for testing a DUT and a response signal of the DUT. Therefore, the hardware module 103 may be eliminated from the master subsystem 10.

The master clock generators 2a and 2b generate master clocks MCLK1 and MCKL2 which are independent of each other, and these master clock generators (means) 2a and 2b and the slave subsystem timing generators 111, 121, . . . are connected to each other through diplexers 41, 42, . . . which constitutes the master clock distribution means.

The master sequencer 102 is connected to the slave sequencers 112 and 122 to supply control signals to the slave sequencers 112 and 122, and also is connected to the control signal synchronizers 3a, 3b.

In FIG. 1, the synchronizer 3a is designed to receive a control signal from the master sequencer 102, and the synchronizer 3b is provided at the rear stage of the synchronizer 3a, and connected to the synchronizer 3a. In addition, although not depicted FIG. 1, synchronizer 3b may also receive its input from master sequencer 102.

Either one of the master clocks MCLK1, MCLK2 may be input to the synchronizers 3a, 3b through the diplexers 7a and 7b, respectively. The synchronizers serve to reclock the control signals from the master sequencer 102. The connection as shown in FIG. 1 is so designed that the signals from the master clock generators 2a and 2b are output to the synchronizers 3a and 3b, respectively.

The synchronizers 3a and 3b are connected to the diplexers 51, 52, . . . which constitute the control synchronized signal distribution means 5.

In this embodiment, the master subsystem 10 receives an output signal of the master clock generator 2a or 2b through the diplexer 6, and generates a timing clock on the basis of the received output signal. Selection of either one of the outputs of the clock generators 2a and 2b as an output signal can be suitably determined; in the FIG. 1 embodiment the selection of the master clock 2a is illustrated.

The operation of the testing device is described below.

The timing generator 101 of the master subsystem 10 receives MCLK1 from the master clock generator 2a through the diplexer 6, and generates a timing clock for the master subsystem 10.

The timing generator 101 generates a timing clock signal by integer-dividing MCLK1, and outputs the timing clock to the master sequencer 102 and the hardware module 103. The master sequencer 102 outputs a control signal with which the hardware module 103 is controlled, and also outputs a control signal with which the slave sequencers 112, 122, . . . of the slave subsystems 11, 12, . . . are controlled. The master sequencer 102 outputs various instructions relating to clock signals, such as an instruction on a division-number of the master clock to the timing generators 111, 121, . . . through a control signal bus. In addition, the master sequencer 102 outputs a timing control signal for each of the timing generators 111, 121, . . . to the synchronizer 3a of the control synchronized signal distribution means 3.

In the FIG. 1 embodiment, the synchronizer 3a and the synchronizer 3b select the master clock generators 2a and 2b, respectively. The synchronizer 3a synchronizes the control signal from the master sequencer 102 with the clock MCLK1 of the master clock generator 2a to output the synchronized control signal as the control synchronized signal to the synchronizer 3b and to each of the input terminals of the respective diplexers 51, 52, . . . . The synchronizer 3b synchronizes the control synchronized signal of the synchronizer 3a with the clock MCLK2 of the master clock generator 2b to output the synchronized signal to the other input terminals of the diplexers 51, 52, . . . constituting the control synchronized signal distribution means 5.

Each of the diplexers 51, 52, . . . selects one of the control synchronized signals output from the synchronizers 3a and 3b on the basis of a selection signal output by the master sequencer 102, and outputs the selected control synchronized signal to a corresponding one of the timing generators 111, 121 . . . . . On the other hand, each of the diplexers 41, 42, . . . , which constitutes the master clock distribution means, selects one of the output signals of the master clock generators 2a and 2b in response to the selection of the control synchronized signal by the diplexers 51, 52, . . . , which constitutes the control synchronized signal distribution means 5. That is, in the FIG. 1 embodiment, the diplexer 51 selects the control synchronized signal of the synchronizer 3a (selects MCLK1), and thus the diplexer 41 selects the same clock as supplied to the master subsystem 10 and outputs it to the timing generator 111. In addition, the diplexer 52 selects the control synchronized signal of the synchronizer 3b, and thus the diplexer 42 selects the clock (MCLK2), which differs from the clock supplied to the master subsystem 10, and outputs it to the timing generator 121.

A distribution pass for MCLK1 and MCLK2 and a distribution pass for the control synchronized signal are beforehand adjusted in time.

In the manner described above, the slave subsystems 11, 12, . . . can input any one of MCLK1 and MCLK2 from the master clock generators 2a and 2b to the timing generators 111, 121, . . . The respective timing generators can generate a timing clock for each slave subsystem through a predetermined dividing operation of an input clock. Moreover, each of the slave sequencers 112, 122, . . . can carry out the control instruction from the master sequencer 102 in synchronism with each of the timing generators 111, 121, . . . , and an operating environment similar to that of the real operation of the DUT can be realized.

The following effects can be obtained:

(1) Since the same operation as the signal generating and measuring operation of the subsystem which is operated with a single clock can be realized with at least two clock systems, both the complicated control of the signal generating and measuring operation and the time management thereof can be simultaneously carried out. A time relationship between different clock systems can be kept in sub-nanosecond order.

(2) Since synchronization of complicated control sequences by the master and slave sequencers can be realized on a master-clock base without a central processing unit, plural signal generating and measuring operations in real time can be carried out.

(3) Even with a DUT having a mixed or integrated digital and analog circuits such as a mixed signal IC, testing under a signal condition and a signal state close to those of the real operating environment of the DUT, including an asynchronous environment, can be carried out, and thus reproducibility and reliability of the testing can be enhanced.

(4) Since a portion for performing asynchronous operations, such as distributing the clocks and the control synchronized signals, is independently provided as the control signal synchronizing means so as not to be distributed in the master subsystem and the slave subsystems, a low-cost design of the subsystems and prevention of deterioration of signal purity can be promoted, and thus high-quality testing can be realized with a low-cost testing device.

The respective blocks depicted in FIG. 1 may be implemented with the following publicly available parts (although the invention is not limited to testing systems employing these parts):

Master clock generators 2a, 2b: Synthesized Signal Generators HP8664, HP8600, etc., from Hewlett-Packard Company (HP).

Synchronizers 3a, 3b: Easily constructed using programmable delay lines and flip-flops, which are commercially available.

Diplexers 41, 42, 51, 52: Two-input multiplexers, MC10H158 or MC10E158, from Motorola (these diplexers are equivalent to RF multiplexers HPE1366A or HPE1367A).

Timing generators 101, 111, 121: Equivalent to Digital Signal Generator HP8175, from Master Sequencer/Slave Sequencer 102, 103: In combination, these may be implemented with an HP8200 IC Evaluation System.

Slave Sequencer/Hardware Module 112/113 or 122/123: In combination, these may be implemented with an HP8770A Arbitrary Waveform Synthesizer, an HP54500 series Digitizing Scope, and an HP5345 Electronic Counter.

What is claimed is:

1. A testing device, comprising:
   (a) a subsystem group comprising a master subsystem and a slave subsystem operated under control of said master subsystem;
   (b) at least two master clock generators;
   (c) master clock distribution means for distributing master clock signals of said master clock generators to said slave subsystem and said master subsystem;
   (d) control signal synchronizing means for receiving a control signal from said master subsystem and synchronizing the control signal with a selected one of the master clock signals, wherein a synchronized control signal is derived; and
   (e) control synchronized signal distribution means for distributing the synchronized control signal to said slave subsystem;
   wherein said control signal synchronizing means comprises (1) a first synchronizer comprising an input operatively coupled to said master subsystem to receive said control signal and an output; and (2) a second synchronizer comprising an input operatively coupled to said output of said first synchronizer and an output; and wherein said control synchronized signal distribution means comprises a diplexer comprising first and second inputs respectively operatively comprising first and second inputs respectively operatively coupled to said outputs of said first and second synchronizers and an output operatively coupled to said slave subsystem.

2. A testing device as recited in claim 1, wherein said first and second synchronizers each comprise a programmable delay line.

3. A testing device as recited in claim 2, wherein said first and second synchronizers each further comprise a flip-flop.

4. A testing device as recited in claim 3, wherein said diplexer comprises a multiplexer.

5. A testing device as recited in claim 4, wherein said master clock distribution means comprises means for selectively distributing said master clock signals to said first and second synchronizers.

6. A testing device as recited in claim 1, wherein said master clock distribution means comprises means for selectively distributing said master clock signals to said first and second synchronizers.

7. A method for testing electronic parts, comprising the steps of:
   (a) generating at least two master clock signals;
   (b) distributing said master clock signals to a master subsystem and at least one slave subsystem;
   (c) generating a control signal with said master subsystem;
   (d) synchronizing said control signal with a selected one of the master clock signals, thereby deriving a synchronized control signal;
   (e) distributing the synchronized control signal to said slave subsystem(s); and
   (f) testing an electronic device in accordance with said synchronized control signal;
   wherein said step of synchronizing the control signal comprises (1) synchronizing the control signal to a first of said two master clock signals and providing a first synchronized control signal; and (2) synchronizing said first synchronized control signal to a second of said two master clock signals and providing a second synchronized control signal.

8. A method as recited in claim 7, wherein said step of distributing the synchronized control signal comprises selectively providing one of said first and second synchronized control signals to said slave subsystem.

9. A method as recited in claim 7, further comprising distributing said control signal, one of said master clock signals, and one of said first and second synchronized control signals to said slave subsystem.

10. A testing device, comprising:
    (a) a subsystem group comprising a master subsystem and a slave subsystem operated under control of said master subsystem, said master subsystem providing a control signal;
    (b) at least two master clock generators;
    (c) a master clock distribution subsystem distributing master clock signals of said master clock generators to said slave subsystem and said master subsystem;
    (d) a control signal synchronizing subsystem comprising (1) a first synchronizer comprising an input operatively coupled to said master subsystem to receive said control signal and an output; and (2) a second synchronizer comprising an input operatively coupled to said output of said first synchronizer and an output; and
    (e) a control synchronized signal distribution subsystem distributing the synchronized control signal to said slave subsystem, comprising a diplexer comprising first and second inputs respectively operatively coupled to said outputs of said first and second synchronizers and an output operatively coupled to said slave subsystem.

11. A testing device as recited in claim 10, wherein said first and second synchronizers each comprise a programmable delay line.

12. A testing device as recited in claim 11, wherein said first and second synchronizers each further comprise a flip-flop.

13. A testing device as recited in claim 12, wherein said diplexer comprises a multiplexer.

14. A testing device as recited in claim 13, wherein said master clock distribution means comprises a second diplexer for selectively distributing said master clock signals to said first and second synchronizers.

15. A testing device as recited in claim 10, wherein said master clock distribution subsystem comprises a second diplexer for selectively distributing said master clock signals to said first and second synchronizers.

* * * * *